US012513968B2

(12) United States Patent
Lu

(10) Patent No.: US 12,513,968 B2
(45) Date of Patent: Dec. 30, 2025

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 430 days.

(21) Appl. No.: 18/168,650

(22) Filed: Feb. 14, 2023

(65) Prior Publication Data
US 2023/0187512 A1 Jun. 15, 2023

Related U.S. Application Data

(63) Continuation of application No. PCT/CN2021/131910, filed on Nov. 19, 2021.

(30) Foreign Application Priority Data

Sep. 27, 2021 (CN) .......................... 202111138596.8

(51) Int. Cl.
H10D 64/27 (2025.01)
H10B 12/00 (2023.01)

(52) U.S. Cl.
CPC ........... H10D 64/513 (2025.01); H10B 12/02 (2023.02); H10B 12/488 (2023.02)

(58) Field of Classification Search
CPC . H01L 21/76224; H10B 12/02; H10B 12/053; H10B 12/485; H10B 12/488; H10D 64/513; H10D 64/516
See application file for complete search history.

(56) References Cited

U.S. PATENT DOCUMENTS 6,063,300 A * 5/2000 Suzuki .............. H01L 21/02063
216/60
10,083,906 B1 9/2018 Jen
10,103,151 B2 10/2018 Ting et al.
(Continued)

FOREIGN PATENT DOCUMENTS

CN 101572230 A 11/2009
CN 105374688 A 3/2016
(Continued)

OTHER PUBLICATIONS

Supplementary European Search Report in the European application No. 21949522.3, mailed on Dec. 20, 2023. 8 pages.

Primary Examiner — Britt Hanley
Assistant Examiner — Kevin Quinto
(74) Attorney, Agent, or Firm — Syncoda LLC; Feng Ma

(57) ABSTRACT

Provided are a semiconductor structure and a method for manufacturing the same. The method includes the following operations. A trench is formed in a substrate. A sacrificial dielectric layer is filled in the trench. The sacrificial dielectric layer is etched gradually to gradually expose a sidewall of the trench, and at least part of the exposed sidewall of the trench is oxidized to form an oxide dielectric layer, in which a thickness of the oxide dielectric layer in the trench gradually increases in a direction extending from a bottom to an opening of the trench. A conductive layer is formed on a surface of the oxide dielectric layer and the conductive layer is formed in the trench.

18 Claims, 15 Drawing Sheets

(56) References Cited

U.S. PATENT DOCUMENTS

| | | |
|---|---|---|
| 10,204,909 B2 | 2/2019 | Ruffell |
| 2002/0104988 A1 | 8/2002 | Shibata |
| 2014/0061807 A1* | 3/2014 | Deng .................. H10D 84/017 |
| | | 438/296 |
| 2014/0361354 A1* | 12/2014 | Ting .................... H10D 84/038 |
| | | 257/288 |
| 2017/0062572 A1* | 3/2017 | Yoo ...................... H10D 30/797 |
| 2017/0092500 A1* | 3/2017 | Wakimoto ........ H01L 21/28105 |
| 2017/0179133 A1 | 6/2017 | Ruffell et al. |
| 2017/0207224 A1 | 7/2017 | Ting et al. |
| 2017/0229467 A1 | 8/2017 | Ting et al. |
| 2018/0190661 A1 | 7/2018 | Wang |
| 2020/0006349 A1 | 1/2020 | Ting et al. |
| 2021/0050426 A1 | 2/2021 | Li |

FOREIGN PATENT DOCUMENTS

| | | |
|---|---|---|
| CN | 108475679 A | 8/2018 |
| CN | 108511518 A | 9/2018 |

* cited by examiner

SEMICONDUCTOR STRUCTURE AND METHOD FOR MANUFACTURING SAME

CROSS-REFERENCE TO RELATED APPLICATIONS

This application is a continuation application of International Application No. PCT/CN2021/131910, filed on Nov. 19, 2021, which claims priority to Chinese Patent Application No. 202111138596.8, filed on Sep. 27, 2021. The disclosures of International Application No. PCT/CN2021/131910 and Chinese Patent Application No. 202111138596.8 are hereby incorporated by reference in their entireties.

BACKGROUND

With the rapid development of the very large scale integrated circuit technology, the size of a semiconductor device is decreasing. Due to the sharp decrease of the size of the semiconductor device, the thickness of the oxide layer of a transistor gate is reduced to 2 nm or even less. While the semiconductor device is scaled down, the working voltage is not correspondingly decreased in the same proportion, which leads to the strong gate-induced-drain-leakage (GIDL) current effect of a short channel device, thereby affecting the reliability of the semiconductor device. Therefore, how to reduce the GIDL current effect in the semiconductor device has become an urgent problem to be solved.

SUMMARY

The embodiments of the disclosure relate to semiconductor technologies, and relate to, but are not limited to, a semiconductor structure and a method for manufacturing the same.

In view of this, embodiments of the disclosure provide a semiconductor structure and a method for manufacturing the same.

In the first aspect, embodiments of the disclosure provide a method for manufacturing a semiconductor structure, which includes the following operations.

A trench is formed in a substrate.

A sacrificial dielectric layer is filled in the trench.

The sacrificial dielectric layer is etched gradually to gradually expose a sidewall of the trench, and at least part of the exposed sidewall of the trench is oxidized to form an oxide dielectric layer, in which a thickness of the oxide dielectric layer in the trench gradually increases in a direction extending from a bottom to an opening of the trench.

A conductive layer is formed on a surface of the oxide dielectric layer and the conductive layer is formed in the trench.

In the second aspect, the embodiments of the disclosure provide a semiconductor structure, which includes a substrate, on which a trench is provided, and a gate structure is provided in the trench.

The gate structure includes an oxide dielectric layer and a conductive layer. The oxide dielectric layer covers on a sidewall of the trench, the conductive layer is located in the trench covered with the oxide dielectric layer. A thickness of the oxide dielectric layer in the trench gradually increases in a direction extending from a bottom to an opening of the trench.

In the embodiments of the disclosure, the sacrificial dielectric layer is filled in trench, and the sidewall of the trench is gradually exposed and oxidized by gradually etching the sacrificial dielectric layer. In this way, the oxide dielectric layer at the bottom of trench is thin, which makes the corresponding gate structure have good switching characteristics. At the same time, the oxide dielectric layer is getting thicker as it is closer towards the opening of the trench. As a result, the GIDL occurred in the overlapping region of the gate structure formed correspondingly and an active area at either side of the trench, thereby improving the reliability and stability of products.

DETAILED DESCRIPTION

Figure 1:
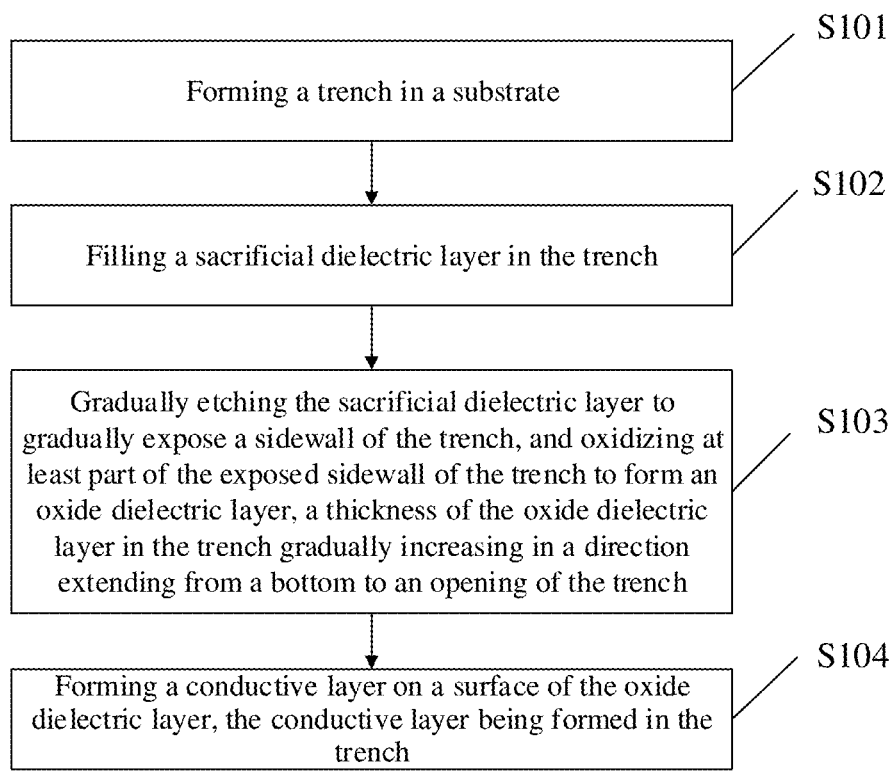
FIG. 1 is a flowchart of a method for manufacturing a semiconductor structure provided by an embodiment of the disclosure.

In order to facilitate understanding of the disclosure, the disclosure will be described more comprehensively hereinafter with reference to the corresponding drawings. Preferred embodiments of the disclosure are shown in the drawings. However the disclosure may be implemented in many different forms and is not limited to the embodiments described herein. In contrast, these embodiments are provided to make the disclosure of the disclosure more thorough and comprehensive.

Unless otherwise defined, all the technical and scientific terms used herein have the same meaning as commonly understood by one person skilled in the art to which this disclosure belongs. The terms used in the specification of the disclosure are for the purpose of describing specific embodiments only and do not intend to limit the disclosure. The term "and/or" as used herein includes any and all combinations of one or more related listed items.

The embodiments of the disclosure provide a method for manufacturing a semiconductor structure, as shown in FIG. 1, the method includes the following operations.

At S101, a trench is formed in a substrate.

At S102, a sacrificial dielectric layer is filled in the trench.

At S103, the sacrificial dielectric layer is etched gradually to gradually expose a sidewall of the trench, and at least part of the exposed the sidewall of the trench is oxidized to form an oxide dielectric layer. A thickness of the oxide dielectric layer in the trench gradually increases in a direction extending from a bottom to an opening of the trench.

At S104, a conductive layer is formed on a surface of the oxide dielectric layer and the conductive layer is formed in the trench.

In the embodiments of the disclosure, the trench is formed on the surface of the substrate by a process of pattern etching. The trench is for forming a semiconductor structure, for example, a gate structure. The gate structure penetrates through an entire semiconductor structure, and acts as a word line of the semiconductor structure. Since the gate structure is buried in the trench, instead of covering the surface of the substrate, this structure is also called as a buried word line (BWL).

There may be a plurality of trenches, which are arranged in parallel in the substrate. Exemplarily, the plurality of trenches may be parallel to each other and have equal spacing, depth and width, or have different spacing and width. The plurality of trenches may be formed synchronously by etching.

After forming the trench, the sacrificial dielectric layer may be filled in trench. The sacrificial dielectric layer is used to assist the formation of the oxide dielectric layer as a gate dielectric layer. Therefore, the sacrificial dielectric layer is removed in the finally formed semiconductor structure.

In the embodiments of the disclosure, the sidewall of the trench is gradually exposed by gradually etching the sacrificial dielectric layer, and the sidewall of the trench is gradually oxidized to form the oxide dielectric layer. By gradually etching the sacrificial layer and oxidizing the sidewall of the trench, the oxidation time of the sidewall of the trench from the opening to the bottom of the trench can be gradually reduced. That is to say, the closer the sidewall to the opening of the trench, the longer the oxidization time, and thus the thicker the formed oxide dielectric layer; and the closer the sidewall to the bottom of the trench, the shorter the oxidization time, and thus the thinner the formed oxide dielectric layer.

Figure 2:
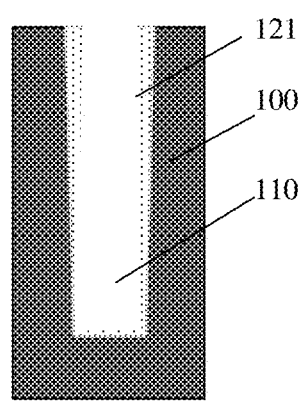
FIG. 2 shows a schematic structural diagram of a gate dielectric layer formed in a method for manufacturing a semiconductor structure provided by an embodiment of the disclosure.

In this way, the thickness of the oxide dielectric layer can gradually increase in the direction extending from the bottom of the trench to the opening of the trench. As shown in FIG. 2, a trench 110 is formed in a substrate 100, and the sidewall of the trench is covered with an oxide dielectric layer 121, and the thickness of the oxide dielectric layer on the sidewall of the trench gradually increases in the direction extending from the bottom to the opening of the trench.

After the oxide dielectric layer is formed, a conductive material may be filled in the trench to form a conductive layer. The conductive material includes a metal or a compound conductive material, for example, metal tungsten (W) or titanium nitride (TiN).

After the conductive layer is formed, the oxide dielectric layer and the conductive layer may be etched back to a target depth, that is, the conductive layer and the oxide dielectric layer in the trench close to the opening are removed. According to the above method in the embodiments of the disclosure, the sidewall of the trench is gradually oxidized by gradually etching the sacrificial dielectric layer, and the oxide dielectric layer, the thickness of which gradually increases in the direction extending from the bottom of the trench to the opening of the trench, can be formed. In this way, the oxide dielectric layer is formed such that it is thinner at the bottom of the trench, and is getting thicker as going closer to the opening of the trench.

In some embodiments, the method further includes the following operation.

Active areas arranged at intervals in the substrate and isolation structures filled between the active areas are formed, in which the trench is formed in the active areas and the isolation structures.

In the embodiments of the disclosure, before the operation of forming the above trench, the active areas and the isolation structures arranged at intervals are formed in the substrate. An active area can be formed by doping a silicon substrate. Every two adjacent active areas are filled with an insulating material therebetween to form an isolation structure. The insulating material may be silicon dioxide.

There is a certain included angle between the extending direction of the active areas and the extending direction of the trench. Exemplarily, the extending direction of the active areas may be perpendicular to the extending direction of the trench.

In an embodiment, the active areas with a certain depth can be formed within the entire region of the substrate by doping, and then the trench is formed by etching the active areas and the isolation structures between the active areas.

The above conductive layer can be used as a gate conductive layer of the semiconductor structure to provide a gate control voltage. The oxide dielectric layer with a gradually changed thickness is located between the active areas and the conductive layer. With the gate control voltage applied to the conductive layer, charge migration occurs in an active area at either side of the trench, thus realizing the switching of a transistor.

It should be noted that, since the active areas and the isolation structures are arranged at intervals, and the trench can penetrate through the entire semiconductor structure, that is, the trench can penetrate through a plurality of active areas and a plurality of isolation structures.

In an embodiment, the above oxide dielectric layer and conductive layer both cover the sidewall of the trench. Therefore, they also penetrate through the plurality of active areas and the plurality of isolation structures.

In another embodiment, the oxide dielectric layer is formed on the sidewall of the trench in the active areas. Since both of the materials of the isolation structures and the oxide dielectric layer may be silicon dioxide, only the sidewall in the active areas is oxidized to form the oxide dielectric layer when forming the oxide dielectric layer. The oxide dielectric layer is integrated with the isolation structures.

In some embodiments, the sacrificial dielectric layer includes an undoped amorphous carbon layer or a doped amorphous carbon layer.

In the embodiments of the disclosure, in order to form the oxide dielectric layer with the gradually changed thickness, the sacrificial dielectric layer may be utilized. The oxide dielectric layer is oxidized simultaneously during gradually removing the sacrificial dielectric layer by etching. The material of the sacrificial dielectric layer may be an amorphous carbon material, including an undoped pure amorphous carbon material or a doped amorphous carbon material. The doped amorphous carbon material may include boron doped amorphous carbon (BALC).

In some embodiments, gradually etching the sacrificial dielectric layer to gradually expose the sidewall of the trench and oxidizing the exposed sidewall of the trench to form the oxide dielectric layer including the following operation.

The sacrificial dielectric layer is etched with oxygen-containing plasma, in which the sacrificial dielectric layer is gradually etched by controlling a flow rate of the oxygen-containing plasma; and the sidewall of the trench is oxidized by the oxygen-containing plasma to form the oxide dielectric layer.

In the embodiments of the disclosure, oxidation reaction may occur between oxygen ions and carbon element in the sacrificial dielectric layer by sputtering the oxygen-containing plasma, so as to remove the sacrificial dielectric layer.

Meanwhile, since the oxygen-containing plasma may be sputtered to the gradually exposed sidewall of the trench which contains silicon, oxidation reaction occurs between the oxygen-containing plasma and silicon element of the sidewall of the trench to form a silicon dioxide film.

During gradually etching the sacrificial dielectric layer, oxygen ions may be sputtered continuously to the sidewall of the trench, thus the silicon dioxide film of the sidewall of the trench is getting thicker and thicker. As the sidewall of the trench is gradually exposed with the gradual consumption of the sacrificial dielectric layer, the sidewall of the trench that is closer to the opening of the trench will be exposed to occur the oxidization reaction for a longer time, thus the thickness of the silicon dioxide film will be greater; while the sidewall of the trench that is closer to the bottom of the trench will be exposed to occur the oxidization reaction for a shorter time, thus the thickness of the formed silicon dioxide film will be thinner. In this way, the silicon dioxide dielectric layer with a gradually changed thickness is formed.

When the sacrificial dielectric layer is completely removed, the bottom of the trench is exposed, where the oxidation reaction takes place to form a silicon dioxide film. In this way, the inner wall of the trench is covered with silicon oxide.

In some embodiments, the oxygen-containing plasma includes steam plasma.

The above oxygen-containing plasma may be the steam plasma, that is, mixed plasma of hydrogen ions and oxygen ions is formed by ionizing steam. In this way, on the one hand, the cost is low, and on the other hand, the reaction speed can be improved and is convenient to be controlled.

In addition, in an embodiment, an inert gas may be mixed in the steam plasma, so as to control the reaction speed and the reaction degree.

In some embodiments, the method further includes the following operation.

The oxide dielectric layer and the conductive layer are etched back to the target depth to form the target structure.

In the semiconductor structure of the embodiments of the disclosure, the trench can be used to form the buried word line, that is, the gate structure is buried in the substrate and connected by the conductive layer so as to be the word line. In the above embodiments, the formed gate dielectric layer covers the whole inner wall of the trench. Therefore, it is necessary to remove the gate dielectric layer on the sidewall to a certain depth from the opening of the trench, and only keep the part of the gate dielectric layer close to the bottom of the trench.

The surfaces of the conductive layer and the oxide dielectric layer may be lower than the opening of the trench. Therefore, the oxide dielectric layer and the conductive layer may be etched back to the target depth, so as to form the target structure located in the trench and having the surface lower than the opening of the trench.

In some embodiments, forming the conductive layer located in the trench on the surface of the oxide dielectric layer including the following operations.

A photoresist is filled in the trench with the top surface of the photoresist being lower than the surface of the substrate after the oxide dielectric layer is formed.

The oxide dielectric layer exposed by the photoresist is removed.

The photoresist is removed.

The conductive layer is deposited in the trench.

Here, the photoresist may be filled in the trench where the oxide dielectric layer has been formed. The thickness of the filled photoresist is less than the depth of the trench. That is to say, after filling the photoresist, part of the trench still maintains un-filled, and part of the oxide dielectric layer is exposed.

At this time, the exposed oxide dielectric layer can be removed by a process of etching, cleaning or the like. Exemplarily, the silicon oxide film can be removed with a hydrofluoric acid solution, while the part of the oxide dielectric layer close to the bottom of the trench is covered by the photoresist and is not removed.

Then, the photoresist can be removed by cleaning, so that the remaining oxide dielectric layer is exposed, which is convenient for the subsequent formation of the conductive layer. Exemplarily, an aqueous solution of sulfuric acid may be adopted as a cleaning fluid for removing the photoresist.

When the above-mentioned photoresist is removed, the trench is exposed again. At this time, the conductive layer may be deposited in the trench, so that the conductive layer is filled on the oxide dielectric layer. At this time, the surface of the conductive layer may be higher than the surface of oxide dielectric layer, then the conductive layer can be etched back to make its surface flush with the surface of the oxide dielectric layer or lower than the surface of the oxide dielectric layer.

By this method, the oxide dielectric layer of a certain thickness at the top of the trench can be removed, so that the opening of the trench is expanded, thereby reducing the influence of early sealing effect during forming the gate structure by depositing the conductive layer.

In some embodiments, forming the conductive layer on the surface of the oxide dielectric layer, in which the conductive layer is in the trench, includes the following operations.

A photoresist is filled in the trench with the top surface of the photoresist being lower than the surface of the substrate after the oxide dielectric layer is formed.

The oxide dielectric layer above the photoresist and part of the isolation structures are removed.

The photoresist is removed.

The conductive layer is deposited in the trench.

In the embodiments of the disclosure, since the materials of the oxide dielectric layer and the isolation structures are the same, in the process of etching, the isolation structures and the oxide dielectric layer exposed above the photoresist are etched away simultaneously to form a groove. At this time, the photoresist is removed, and then the conductive layer can be deposited on oxide dielectric layer in the trench.

In this way, a larger opening can be formed at the opening of the trench, and the early sealing effect can be prevented when the conductive layer is deposited.

In some embodiments, depositing the conductive layer in the trench includes the following operation.

A conductive material is deposited in the trench and the conducting material is controlled to be deposited to a target height to form the conductive layer, in which the target height of the conductive layer is less than the depth of the trench.

In some embodiments, the target height of the conductive layer is equal to or greater than the height of the oxide dielectric layer.

In the embodiments of the disclosure, the metal material can be filled into the trench by a process of depositing to cover the oxide dielectric layer. Here, the process of depositing may include a process of physical vapor deposition (PVD), atomic layer deposition (ALD) or the like.

Here, the target height of the conductive layer is less than the depth of the trench. That is to say, the top surface of the conductive layer can be flush with the top surface of the oxide dielectric layer, part of which is etched away by etching back, or can be slightly lower than the top surface of the oxide dielectric layer, provided that the top surface of the conductive layer is lower than the top surface of the trench, and the conductive layer is not in contact with the silicon material of the sidewall of the trench. In this way, the conductive layer and the oxide dielectric layer form a complete gate structure.

In addition, the trench extends along the surface of substrate and penetrates through a plurality of active areas and a plurality of isolation structures. Therefore, the conductive layer also passes through to form a word line.

Figure 3:
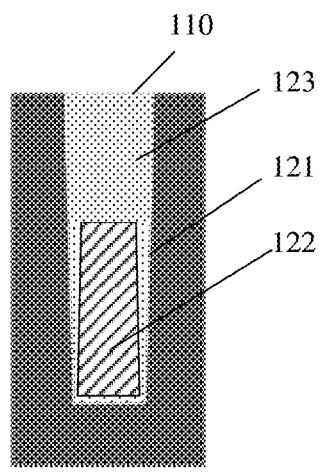
FIG. 3 shows a schematic diagram of a gate structure formed in a method for manufacturing a semiconductor structure provided by an embodiment of the disclosure.

In some embodiments, as shown in FIG. 3, the method further includes the following operation.

An insulating layer 123 is covered on the conductive layer 122 and the oxide dielectric layer 121, and is located in the trench 110.

After forming the above conductive layer and oxide dielectric layer, the insulating layer can be covered on the conductive layer and the oxide dielectric layer to protect the gate structure.

Since the top surfaces of the conductive layer and the oxide dielectric layer is lower than the surface of the substrate, that is, there is still some space after forming the gate structure in the trench. Therefore, the insulating layer covering the gate structure can be formed by depositing the insulation material in the trench, so that the conductive layer penetrating through the trench is called the buried word line.

In some embodiments, the insulating layer includes a silicon nitride layer.

In other embodiments, the insulating layer may also include an oxide, or a thin film of an organic material.

In some embodiments, covering the insulating layer on the conductive layer and the oxide dielectric layer includes the following operation.

The insulating material is deposited in the trench by a process of low pressure chemical vapor deposition to form the insulating layer covering the conductive layer and the oxide dielectric layer.

In the embodiments of the disclosure, the insulating layer can be formed by uniformly depositing silicon nitride in the remaining space of the trench by the process of low pressure chemical vapor deposition (LPCVD), so as to form the insulating layer covering the gate structure.

Figure 4:
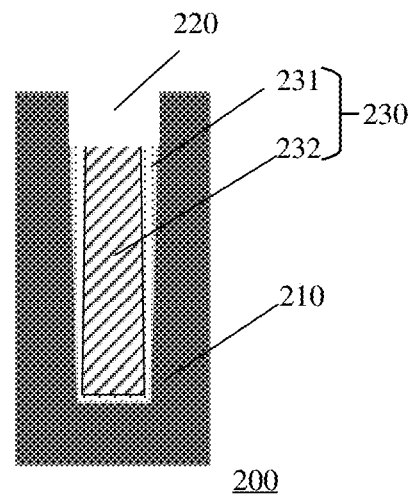
FIG. 4 shows a schematic diagram of a semiconductor structure provided by an embodiment of the disclosure.

The embodiments of the disclosure provide a semiconductor structure, as shown in FIG. 4. A semiconductor structure 200 includes a substrate 210, which is provided with a trench 220, and a gate structure 230 is provided in the trench 220.

The gate structure 230 includes an oxide dielectric layer 231 and a conductive layer 232. The oxide dielectric layer 231 covers on the sidewall of the trench 220, the conductive layer 232 is located in the trench 220 covered with the oxide dielectric layer 231. The thickness of the oxide dielectric layer 231 gradually increases in the direction extending from the bottom of the trench 220 to the opening of the trench 220 in the trench 220.

In the embodiments of the disclosure, there may be a plurality of trenches, which are arranged at intervals in the substrate. One trench, two trenches or even more trenches can be formed on one active area, and these trenches can be arranged in parallel in the substrate in a direction parallel to the surface of the substrate. Exemplarily, the plurality of trenches may be parallel to each other and have equal spacing, depth and width, or may have different spacing and width.

The gate structure is provided in the trench. The gate structure is used as the switching control structure of a transistor, and can play a role of switch the conductive state of a conductive channel. Here, the gate structure is distributed in the trench and form a buried word line.

The gate structure includes the oxide dielectric layer and the conductive layer, and the oxide dielectric layer is used for isolating the conductive layer from the substrate, and thus covers the inner wall of the trench. In the embodiments of the disclosure, the oxide dielectric layer located on the sidewall of the trench has the characteristics of a gradually changed thickness. The thickness of the oxide dielectric layer gradually increases in the direction extending from the bottom of the trench to the opening of the trench. In this way, the oxide dielectric layer at the bottom of trench is thinner, which ensures the switching characteristic of the gate structure. Meanwhile, the oxide dielectric layer closer to the opening of the trench is thicker. As a result, the GIDL occurred in the overlapping region of the gate structure and the substrate at either side of the trench is reduced, thereby improving the reliability and stability of the product.

Figure 5:
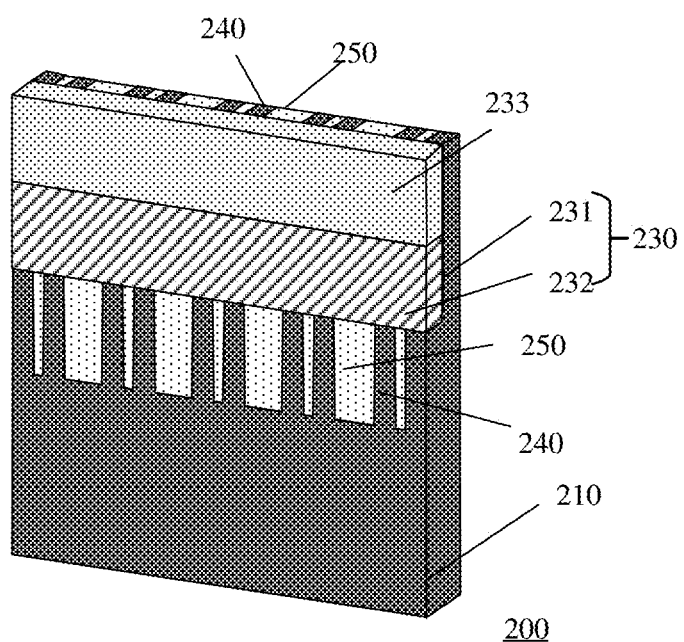
FIG. 5 shows a schematic diagram of a semiconductor structure provided by an embodiment of the disclosure.

In some embodiments, FIG. 5 shows a cross-sectional diagram of the semiconductor structure in the trench direction. As shown in FIG. 5, the semiconductor structure 200 further includes active areas 240 arranged at intervals in the substrate and isolation structures 250 filled between the active areas 240. The trench 220 is located in the active areas 240 and the isolation structures 250.

In the embodiments of the disclosure, an active area may be made of a doped semiconductor material which has certain conductivity. An active area can be used as a source region and a drain region of a transistor, and charges are driven to transfer in a semiconductor channel under the action of a gate control voltage. The active area can be connected with an external wire by a contact structure to realize the transmission of electrical signals.

The isolation structures are provided between the active areas arranged at intervals. An isolation structure can be made of an insulating material including silicon dioxide, silicon nitride or other organic materials. The isolation structures can play the role of electrical isolation between adjacent active areas, so that each active area can be used for an independent transistor structure, thus an array structure of transistors is formed. The above trenches are formed in the active areas and the isolation structures, and the gates are located in the trenches, thus forming transistor structures with the active areas.

In some embodiments, the oxide dielectric layer is formed in the trench in the active areas.

During the process of oxidizing the inner wall of the trench, the sidewalls of the active areas in the trench are oxidized to form the above oxide dielectric layer. If the material of the isolation structures is silicon dioxide, it is the same as the material of the oxide dielectric layer, so the oxide dielectric layer is integrated with the isolation region after formation. In some embodiments, the top surfaces of the conductive layer and the oxide dielectric layer are lower than the surface of the substrate. As shown in FIG. 5, the semiconductor structure further includes an insulating layer 233.

The insulating layer 233 is located in the trench 220 and covers the conductive layer 232 and the oxide dielectric layer 231, in which the insulating layer 233 is used for protecting the gate structure.

Since the conductive layer is located in the trench, in order to facilitate the formation of other structures including storage capacitors, bit lines or the like on the surface of the substrate, the conductive layer can be covered by the insulating layer. In this way, the gate structure can be buried in the substrate, reducing the electrical interference with other structures.

In some embodiments, the trench penetrates through a plurality of active areas and a plurality of isolation structures arranged at intervals, and the gate structure is conductive in the trench. The surface width of the gate structure in an isolation structure is greater than the surface width of the gate structure in an active area in the direction parallel to the active areas. In the embodiments of the disclosure, the trench is located in the active areas and the isolation structures arranged at intervals. The trench can penetrate through multiple active areas, so as to be used as the word line of the semiconductor structure to provide gate control signals for multiple transistors.

Figure 6A:
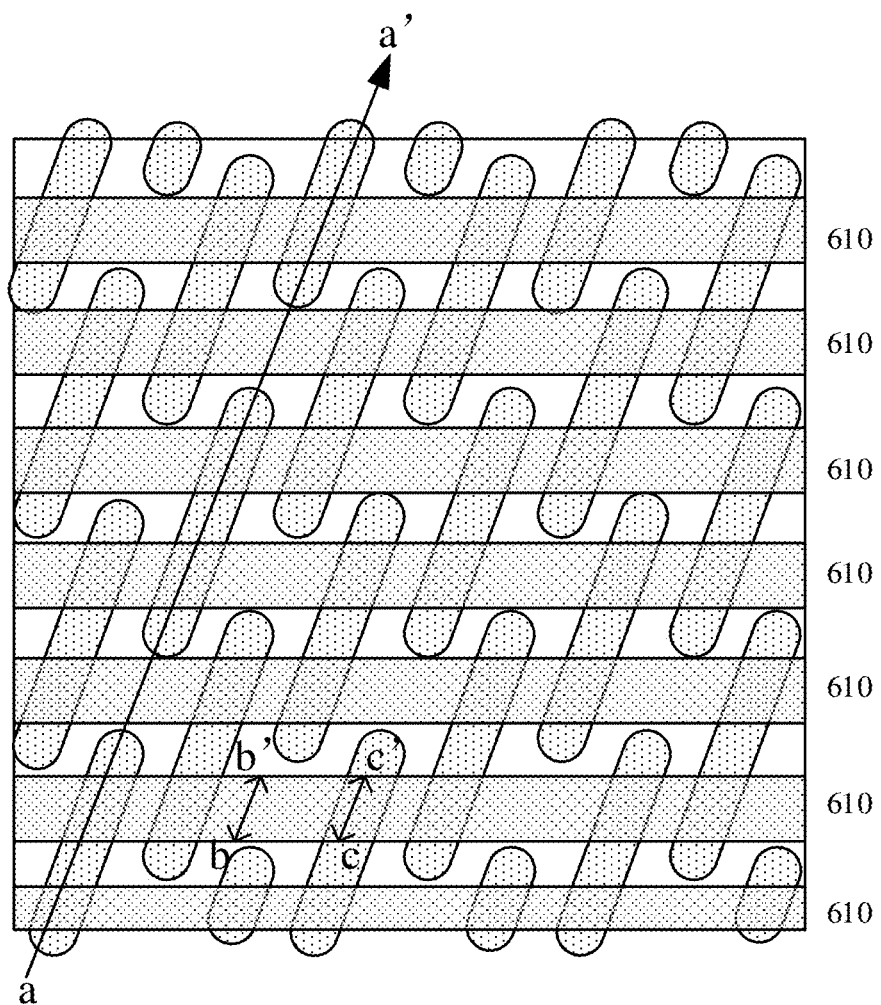
FIG. 6A shows a top view of a semiconductor structure provided by an embodiment of the disclosure.

In an embodiment of the disclosure, as shown in FIG. 6A, the active areas may be divided into a plurality of regions separated by the isolation structures in a direction parallel to the extending direction of the active areas aa'. The gate structures 610 penetrate through the active areas and the isolation structures to form multiple word lines. The isolation structures can be formed of silicon dioxide. Therefore, when the surfaces of active areas are oxidized in the direction aa', the surfaces of the isolation structures cannot be oxidized to form silicon oxide. Whereas, when removing the oxide dielectric layer on the surfaces of the active areas, a part of each isolation structure is also etched, that is, when the oxide dielectric layer is removed, the isolation structures are also partially etched simultaneously. The surface width bb' of the part of gate structure 610 formed in an isolation structure is greater than the surface width cc' of the part of gate structure 610 between active areas in the direction parallel to aa'.

Figure 6B:
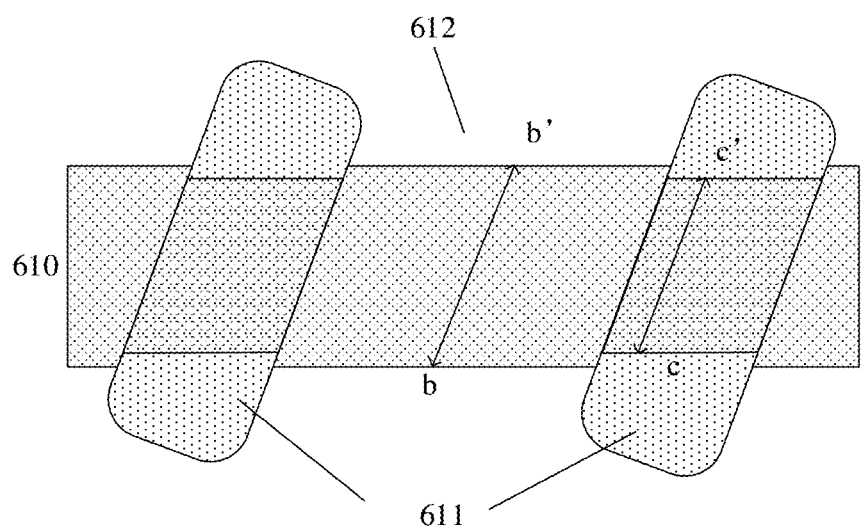
FIG. 6B shows a partial enlarged diagram of FIG. 6A.

FIG. 6B shows a partially enlarged schematic diagram of the surface where the gate structure is located. The gate structure 610 penetrates through multiple isolation structures 612 and multiple active areas 611, and the surface width bb' of the gate structure 610 in one isolation structure 612 is greater than the surface width cc' of the gate structure 610 in one active area 611.

In some embodiments, the semiconductor structure further includes a contact structure located on the surface of one of the active areas.

On the one hand, the contact structure is connected to the surface of the active area; on the other hand, it is used to connect with an external line. For example, a bit line contact structure is connected with a bit line, so that signals from the bit line can be transmitted to the active area by the bit line contact structure. A storage node contact structure is connected with an external storage capacitor. When a transistor is turned on by a gate control signal, the signal transmitted by the bit line can pass through the semiconductor conducting channel via the active area connected with the bit line contact structure, then pass through the active area and the storage node contact structure, and reach the storage capacitor, thus realizing data reading or writing.

The embodiments of the disclosure provide the following example.

In a memory product such as a DRAM, a word line is used for providing a gate control signal controlling a transistor to turn on. When the transistor is turned on, the current is transferred from a bit line to a storage capacitor through the transistor.

Figure 7:
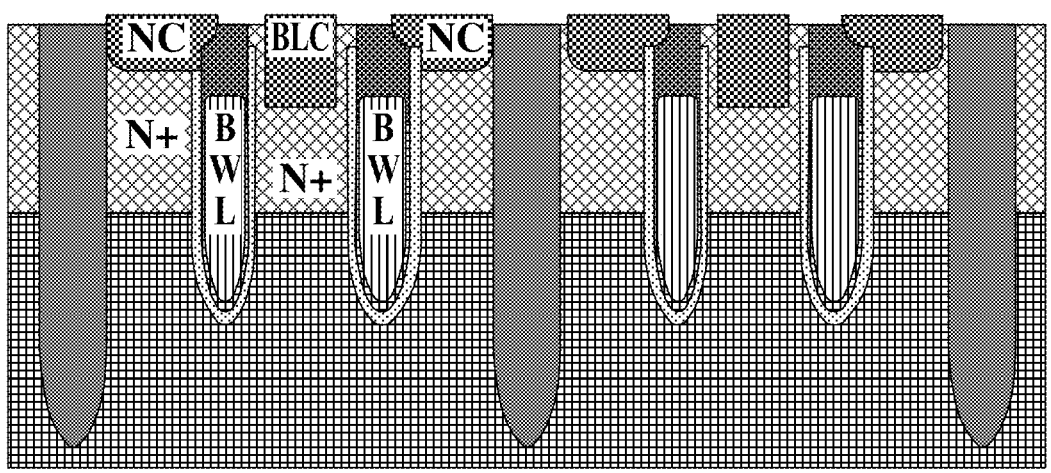
FIG. 7 shows a schematic diagram of a semiconductor structure provided by an embodiment of the disclosure.

As shown in FIG. 7, in a device structure, it is desired that the top of the conductive layer of a buried word line (BWL) is flush with the bottom of a contact structure. The contact structure here includes a bit line contact structure (BLC) and a storage node contact structure (NC). However, complete alignment is hardly achieved in the actual manufacturing process, and there are overlapping areas between the BWL and the contact structures as well as an ion implanted region N+, which lead to problems of the current leakage and increase of parasitic capacitance.

In the embodiments of the disclosure, an oxide dielectric layer with a gradually changed thickness is formed by the following operations. The part of the oxide dielectric layer close to the bottom of a trench is thinner, and thus, the bottom of the conductive layer has a good switching characteristic, and the parasitic capacitance is small. Meanwhile, the part of the oxide dielectric layer close to the top of the trench is thicker, and thus, the electric field between the conductive layer and a contact structure as well as an ion implanted region can be reduced, thus reducing the occurrence of current leakage such as GIDL.

Figure 8A:
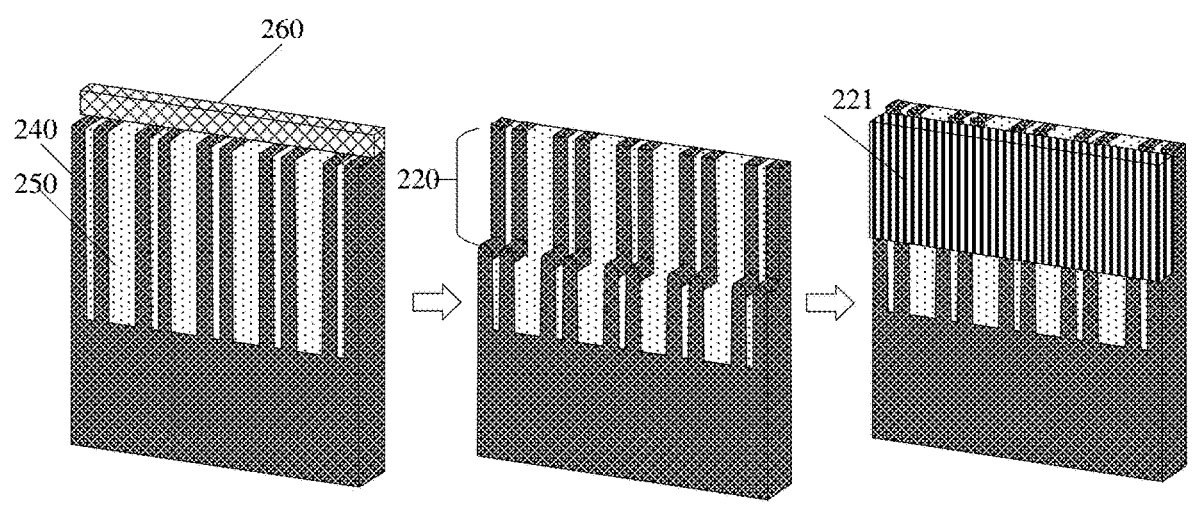
FIG. 8A shows cross-sectional schematic diagrams corresponding to operations of a method for manufacturing a semiconductor structure provided by an embodiment of the disclosure.

FIG. 8A shows cross-sectional schematic diagrams illustrating the operations along the extending direction and in the center of a trench 220.

As shown in FIG. 8A, after active areas 240 arranged at intervals and isolation structures 250 are formed in a substrate, the trench 220 perpendicular to the distribution direction of the active areas is formed.

Prior to the formation of the trench, a mask layer 260 may be covered on the surface of the substrate, and then the trench 220 may be formed by etching. The mask layer 260 may be removed after the formation of the trench, and of course, the mask layer 260 may also be removed after the formation of a gate structure in the trench. Since active areas 240 are formed of silicon and isolation structures 250 are formed of silicon dioxide, the silicon and the silicon dioxide need to be etched down simultaneously in the process of forming the trench by etching to form the trench 220 with a certain depth, which is the depth required by a buried word line.

Figure 8B:
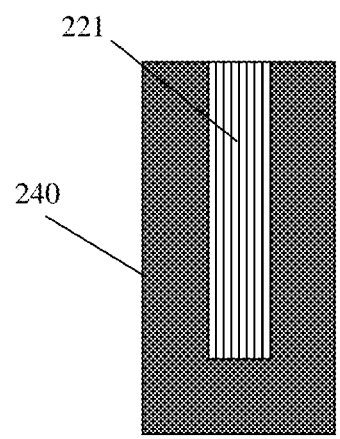
FIG. 8B shows a cross-sectional schematic diagram of a structure formed in a method for manufacturing a semiconductor structure provided by an embodiment of the disclosure.

After the trench 220 is formed, boron doped amorphous carbon (BACL) is deposited in the trench 220 to form a sacrificial dielectric layer 221, so that the trench 220 is filled up. At this time, a cross-sectional schematic diagram perpendicular to the extending direction of the trench is shown in FIG. 8B.

Figure 9A:
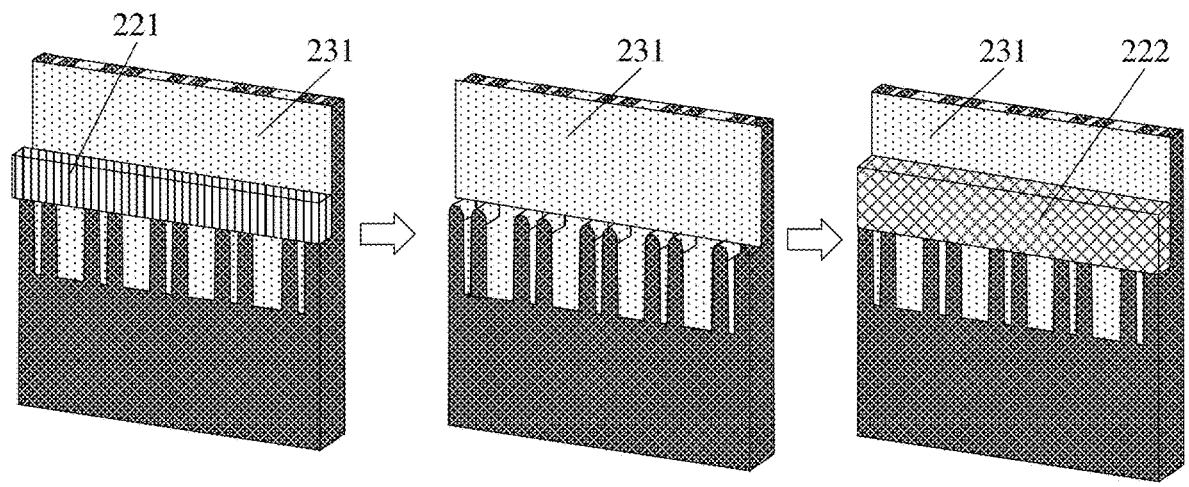
FIG. 9A shows cross-sectional schematic diagrams corresponding to operations of a method for manufacturing a semiconductor structure provided by an embodiment of the disclosure.

FIG. 9A shows cross-sectional schematic diagrams illustrating the operations along the extending direction and in the center of the trench 220. As shown in FIG. 9A, after the sacrificial dielectric layer 221 is formed, a steam is formed by ionization of oxygen $O_2$ and hydrogen $H_2$, or a steam plasma is formed by ionizing steam to form mixed plasma of hydrogen ions and oxygen ions. The BACL is gradually cleaned from top down by plasma sputtering. At the same time, an oxidation reaction occurs between the oxygen ions in the plasma and the silicon element of the sidewall of the trench gradually exposed to form a silicon dioxide thin film. In this way, the silicon dioxide thin film with gradually reduced thickness from top down can be formed on the sidewall of the trench as an oxide dielectric layer 231, and the remaining space in the trench forms a trapezoidal space. Moreover, in this process, the consumption speed of the BACL can be controlled by controlling the gas flow rate, thereby controlling the thickness of the silicon oxide layer.

Figure 9B:
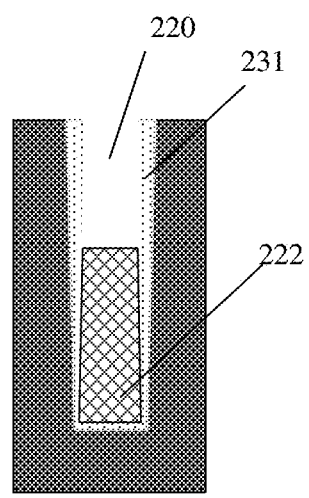
FIG. 9B shows a cross-sectional schematic diagram of a structure formed in a method for manufacturing a semiconductor structure provided by an embodiment of the disclosure.

As shown in FIG. 9A, since the height of the gate structure is less than the depth of the trench, it is necessary to reduce the height of the sidewall of the trench 220 covered by the oxide dielectric layer 231 after the oxide dielectric layer 231 is formed. Here, a photoresist (PR) 222 is deposited in the trench first, and the deposited thickness is the required height of a gate structure 230. At this time, a cross-sectional schematic diagram perpendicular to the extending direction of the trench is shown in FIG. 9B.

Figure 9C:
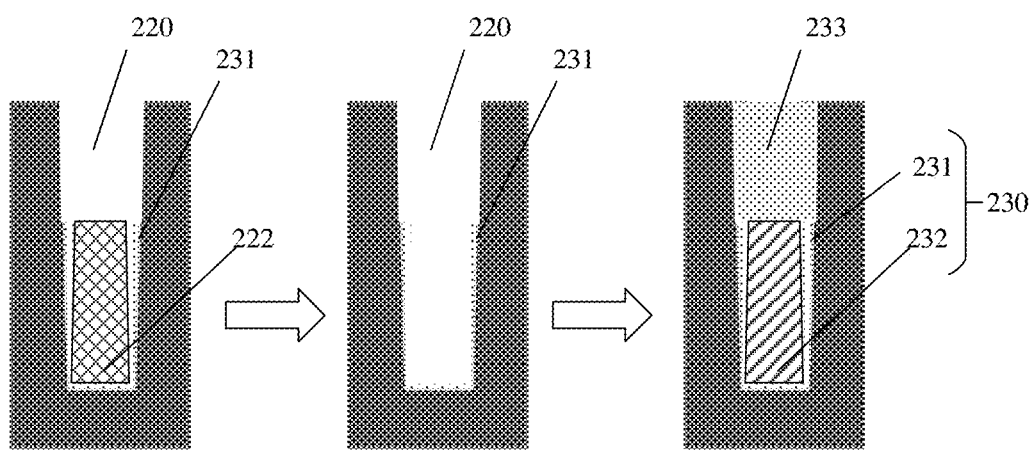
FIG. 9C shows a cross-sectional schematic diagram of a structure formed in a method for manufacturing a semiconductor structure provided by an embodiment of the disclosure.
Figure 9D:
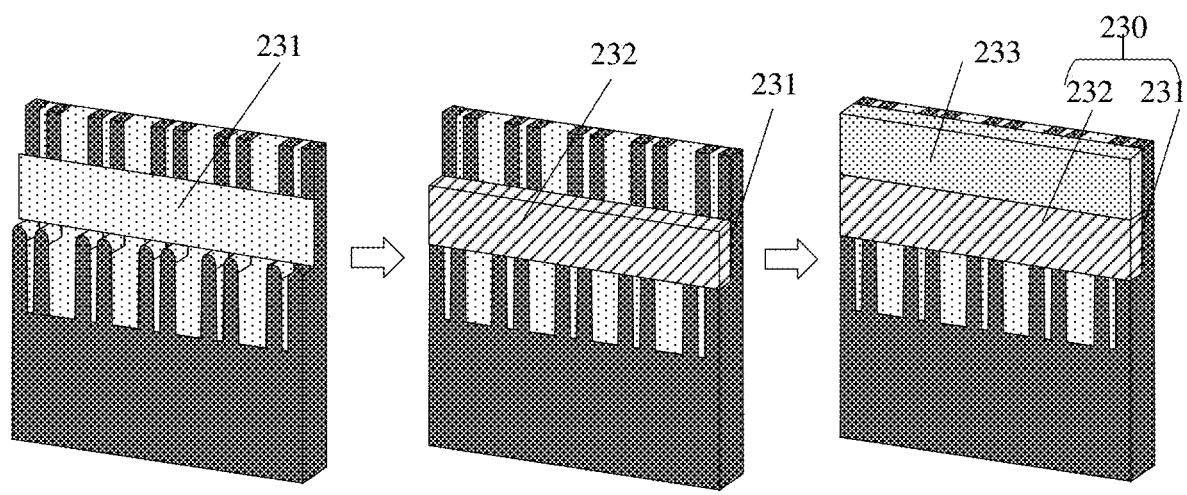
FIG. 9D shows cross-sectional schematic diagrams corresponding to operations of a method for manufacturing a semiconductor structure provided by an embodiment of the disclosure.
Figure 10:
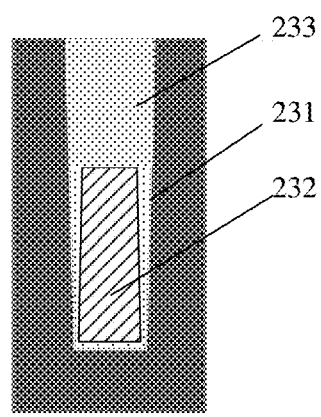
FIG. 10 shows a cross-sectional schematic diagram of a structure formed in a method for manufacturing a semiconductor structure provided by an embodiment of the disclosure.

Next, as shown in FIG. 9C, the silicon oxide layer above the photoresist 222 can be cleaned, and then the photoresist 222 is removed. In this way, the remaining silicon oxide layer is used as the oxide dielectric layer 231 of the gate structure. Then, titanium nitride or metal tungsten is deposited as a conductive layer 232, and finally, an insulating layer 233 is deposited to cover the conductive layer 232. FIG. 9D shows the schematic stereo-diagrams corresponding to the cross-sectional diagrams illustrating the operations in the above process. In this way, the remaining trench has a larger opening, which can be effectively filled with metal materials and then etched to the required height of a word line, thus reducing the occurrence of early sealing effect. Finally, in the remaining space of the trench 220, a silicon nitride film as the insulating layer 233 is formed by depositing silicon nitride with a process of LPCVD, or by the reaction of silane ($SiH_4$) and dichlorosilane ($SiH_2Cl_2$) to cover the gate structure 230, to form the buried word line. FIG. 10 shows a cross-sectional schematic diagram perpendicular to the extending direction of the trench.

It should be noted that, in the embodiments of the disclosure, the etching gas for silicon, silicon oxide and silicon nitride may use a gas of one of or a mixture of two or more in a certain proportion of sulfur hexafluoride ($SF_6$), carbon tetrafluoride ($CF_4$), chlorine ($Cl_2$), trifluoromethane ($CHF_3$), oxygen ($O_2$), or argon (Ar).

According to the technical solution of the embodiments of the disclosure, the gate structure with the conductive layer gradually getting thinner from top down can be formed, which can effectively reduce the situation of GIDL.

In addition, the silicon oxide layer above the word line is etched away, so that the opening is larger during the formation of the gate structure, thereby reducing the early sealing effect.

It should be understood that, the references to "an embodiment" or "one embodiment" throughout the specification mean that a specific feature, structure or characteristic related to the embodiment is included in at least one embodiment of the disclosure. Therefore, "in an embodiment" or "in one embodiment" appearing throughout the specification do not necessarily refer to the same embodiment. In addition, these particular features, structures or characteristics may be incorporated in any suitable manner in one or more embodiments. It should be understood that, in the various embodiments of the disclosure, the number of the serial numbers of the above-mentioned processes does not imply the order of execution order, and the execution order of the processes should be determined by their function and inherent logic, and should not constitute any limitation on the disclosure. The serial numbers of the above embodiments of the disclosure are for description only, and do not represent the advantages and disadvantages of the embodiments.

It should be noted that, in this disclosure, the terms "include", "comprise" or any other variation thereof are intended to cover non-exclusive inclusion, so that a procedure, method, article or device that includes a series of elements not only includes those elements, but also includes other elements not explicitly listed, or also includes elements inherent to such procedure, method, article or device. Without further limitation, the element defined by the statement "including an . . . " does not exclude the existence of another identical element in the process, method, article or device that includes the element.

The above are only some embodiments of the disclosure, but the protection scope the disclosure is not limited to this. Changes or replacements can be easily conceived of by any person skilled in the art and such changes or replacements should be covered by the protection scope of the disclosure. Therefore, the protection scope of the disclosure should be subject to the protection scope of the claims.

INDUSTRIAL PRACTICABILITY

In embodiments of the disclosure, a sacrificial dielectric layer is filled in a trench, and a sidewall of the trench is gradually exposed and oxidized during gradually etching the sacrificial dielectric layer. In this way, an oxide dielectric layer at the bottom of the trench is thinner, so that the corresponding gate structure has good switching characteristics. Meanwhile, the oxide dielectric layer closer to the opening of the trench is getting thicker. As a result, GIDL occurred in the overlapping region of the gate structure formed correspondingly and an active area at either side of the trench is reduces, thereby improving the reliability and stability of products.

The invention claimed is:

1. A method for manufacturing a semiconductor structure, comprising:
   forming a trench in a substrate;
   filling a sacrificial dielectric layer in the trench;
   gradually etching the sacrificial dielectric layer to gradually expose a sidewall of the trench, and oxidizing at least part of the exposed sidewall of the trench to form an oxide dielectric layer, wherein a thickness of the oxide dielectric layer in the trench gradually increases in a direction extending from a bottom to an opening of the trench; and forming a conductive layer on a surface of the oxide dielectric layer, the conductive layer being formed in the trench;

wherein forming the conductive layer on the surface of the oxide dielectric layer, the conductive layer being formed in the trench, comprises:

filling a photoresist in the trench after the oxide dielectric layer is formed, wherein a top surface of the photoresist is lower than a surface of the substrate;

removing the oxide dielectric layer exposed by the photoresist;

removing the photoresist; and depositing the conductive layer in the trench.

2. The method according to claim 1, wherein the sacrificial dielectric layer comprises an undoped amorphous carbon layer or a doped amorphous carbon layer.

3. The method according to claim 1, further comprising:
etching back the oxide dielectric layer and the conductive layer to a target depth to form a target structure.

4. The method according to claim 1, further comprising:
forming active areas arranged at intervals in the substrate and isolation structures filled between the active areas, wherein the trench is formed in the active areas and the isolation structures.

5. The method according to claim 4, wherein the oxide dielectric layer is formed on the sidewall of the trench in the active areas.

6. The method according to claim 1, wherein gradually etching the sacrificial dielectric layer to gradually expose the sidewall of the trench, and oxidizing at least part of the exposed sidewall of the trench to form the oxide dielectric layer, comprises:

etching the sacrificial dielectric layer with oxygen-containing plasma, wherein the sacrificial dielectric layer is gradually etched the by controlling a flow rate of the oxygen-containing plasma; and oxidizing the sidewall of the trench with the oxygen-containing plasma to form the oxide dielectric layer.

7. The method according to claim 6, wherein the oxygen-containing plasma comprises steam plasma.

8. The method according to claim 1, wherein the depositing the conductive layer in the trench, comprises:

depositing a conductive material in the trench and controlling the conductive material to be deposited to a target height to form the conductive layer, wherein the target height of the conductive layer is less than a depth of the trench.

9. The method according to claim 8, wherein the target height of the conductive layer is not less than a height of the oxide dielectric layer.

10. The method according to claim 1, further comprising:
forming an insulating layer on the conductive layer and the oxide dielectric layer that covers them, wherein the insulating layer is located in the trench.

11. The method according to claim 10, wherein forming the insulating layer on the conductive layer and the oxide dielectric layer that covers them, comprises:

depositing an insulating material in the trench by a process of low pressure chemical vapor deposition to form the insulating layer covering the conductive layer and the oxide dielectric layer.

12. A method for manufacturing a semiconductor structure, comprising:

forming a trench in a substrate;

filling a sacrificial dielectric layer in the trench;

gradually etching the sacrificial dielectric layer to gradually expose a sidewall of the trench, and oxidizing at least part of the exposed sidewall of the trench to form an oxide dielectric layer, wherein a thickness of the oxide dielectric layer in the trench gradually increases in a direction extending from a bottom to an opening of the trench;

forming a conductive layer on a surface of the oxide dielectric layer, the conductive layer being formed in the trench; and forming active areas arranged at intervals in the substrate and isolation structures filled between the active areas, wherein the trench is formed in the active areas and the isolation structures;

wherein forming the conductive layer on the surface of the oxide dielectric layer, the conductive layer being formed in the trench, comprises:

filling a photoresist in the trench after the oxide dielectric layer is formed, wherein a top surface of the photoresist is lower than a surface of the substrate;

removing the oxide dielectric layer above the photoresist and part of the isolation structures;

removing the photoresist; and depositing the conductive layer in the trench.

13. The method according to claim 12, wherein depositing the conductive layer in the trench, comprises:

depositing a conductive material in the trench and controlling the conductive material to be deposited to a target height to form the conductive layer, wherein the target height of the conductive layer is less than a depth of the trench.

14. The method according to claim 13, wherein the target height of the conductive layer is not less than a height of the oxide dielectric layer.

15. A semiconductor structure, comprising:

a substrate, wherein a trench is provided on the substrate, and a gate structure is provided in the trench, the gate structure comprises an oxide dielectric layer and a conductive layer, wherein the oxide dielectric layer covers a sidewall of the trench, the conductive layer is located in the trench covered with the oxide dielectric layer, a thickness of the oxide dielectric layer in the trench gradually increases in a direction extending from a bottom to an opening of the trench;

wherein top surfaces of the conductive layer and the oxide dielectric layer are lower than a surface of the substrate, and the semiconductor structure further comprises:

an insulating layer located in the trench and covering the conductive layer and the oxide dielectric layer, wherein the insulating layer is configured to protect the gate structure.

16. The semiconductor structure according to claim 15, wherein the trench penetrates through a plurality of active areas and a plurality of isolation structures arranged at intervals, and the gate structure is conductive in the trench, and a surface width of the gate structure in the isolation structures is greater than a surface width of the gate structure in the active areas in a direction parallel to the active areas.

17. The semiconductor structure according to claim 15, further comprising:

active areas arranged at intervals in the substrate and isolation structures filled between the active areas, wherein the trench is located in the active areas and the isolation structures.

18. The semiconductor structure according to claim 17, wherein the oxide dielectric layer is formed in the trench located in the active areas.

* * * * *